BASE LOAD CIRCUIT FOR SEMICONDUCTOR RECTIFIER

Filed Jan. 22, 1964 7 Sheets-Sheet 1

INVENTOR.
FRANCIS R. BINGHAM
BY
OSTROLENK, FABER, GERB & SOFFEN
ATTORNEYS

INVENTOR.
FRANCIS R. BINGHAM
BY
OSTROLENK, FABER, GERB & SOFFEN
ATTORNEYS

INVENTOR
FRANCIS R. BINGHAM
BY
OSTROLENK, FABER, GERB & SOFFEN
ATTORNEYS

Sept. 26, 1967 F. R. BINGHAM 3,344,359

BASE LOAD CIRCUIT FOR SEMICONDUCTOR RECTIFIER

Filed Jan. 22, 1964 7 Sheets-Sheet 4

INVENTOR.
FRANCIS R. BINGHAM

BY

OSTROLENK, FABER, GERB & SOFFEN

ATTORNEYS

Sept. 26, 1967 F. R. BINGHAM 3,344,359

BASE LOAD CIRCUIT FOR SEMICONDUCTOR RECTIFIER

Filed Jan. 22, 1964 7 Sheets-Sheet 5

INVENTOR
FRANCIS R. BINGHAM
BY
OSTROLENK, FABER, GERB & SOFFEN
ATTORNEYS

Sept. 26, 1967 F. R. BINGHAM 3,344,359

BASE LOAD CIRCUIT FOR SEMICONDUCTOR RECTIFIER

Filed Jan. 22, 1964 7 Sheets-Sheet 6

INVENTOR.
FRANCIS R. BINGHAM

BY

OSTROLENK, FABER, GERB & SOFFEN
ATTORNEYS

INVENTOR.
FRANCIS R. BINGHAM
BY
Ostrolenk, Faber, Gerb & Soffen
ATTORNEYS

United States Patent Office 3,344,359
Patented Sept. 26, 1967

3,344,359

BASE LOAD CIRCUIT FOR SEMICONDUCTOR RECTIFIER

Francis R. Bingham, Norristown, Pa., assignor to I-T-E Circuit Breaker Company, Philadelphia, Pa., a corporation of Pennsylvania Filed Jan. 22, 1964, Ser. No. 339,503
6 Claims. (Cl. 330—8)

ABSTRACT OF THE DISCLOSURE

In order to permit at least magnetizing current to flow through the control reactors of a magnetically controlled rectifier, a base load circuit, which contains an artificial load, is connected in series with the reactors and independently of the main load terminals of the rectifier. An auxiliary reactor control is connected in series with the artificial load, and is regulated by an input control circuit which is also connected to the main control reactors such that the necessary magnetizing current for the main control reactors will always flow through the artificial load circuit regardless of the voltage regulation state of the main control reactors.

This invention relates to semiconductor rectifiers having magnetic control reactors, and more specifically relates to a low power consuming base load circuit for such rectifiers.

Magnetic amplifiers using self-saturating reactors are commonly used to control the output power of various types of rectifiers, typically of semiconductor-type rectifiers. In this type arrangement, a minimum gate current must flow through the gate windings of the reactors in order to obtain magnetic control of the devices. That is to say, in order for the reactor to traverse some desired flux excursion, the current through the gate winding must at least supply the magnetizing current of the reactors.

When load current is being drawn, this problem is normally non-existent, since the load current is sufficient to magnetize the reactors. However, in many cases it is desirable to regulate the output power of the system to some specified voltage prior to its connection to the main load. In other cases, the regulation range of the output voltage may be so great that the load current delivered to the main load is insufficient to satisfy the magnetizing current of the reactors.

One conventional method to overcome these problems is in the provision of a dummy load across the D-C load terminals. This type arrangement, however, requires extremely large dummy loads where there is to be a wide range of voltage regulation. More specifically, the size of the resistance for a dummy base load resistor is selected for the minimum current to be drawn at the minimum voltage output of the device. For example, if 10 amperes is the minimum requirement of load current for suitable operation of the control reactors, and the lowest regulated output voltage is 5 volts, the load resistor must have a rating of 0.5 ohms. The corresponding power rating at this condition is 50 watts. If, however, this unit must also supply voltages as high as 100 volts, this resistor will draw 200 amperes so that the power rating of the resistor is necessarily increased to 20,000 watts. Thus, the resistor must be rated at 400 times that actually required to meet the necessary operating conditions for the base load resistor.

In general, this ratio may be expressed by $$\frac{P_{max.}}{P_{min.}}=\left(\frac{E_{max.}}{E_{min.}}\right)^2$$

In this relationship, $P_{max.}$ is the design power rating criteria, $P_{min.}$ the minimum power rating required to satisfy the regulating requirements, while $E_{max.}$ and $E_{min.}$ are the highest and lowest D-C voltages respectively applied to the resistor.

This inherent problem of an extremely large base load resistor for a widely regulated unit can be avoided, for example, by switching in different load resistors of different values, depending upon the particular output voltage of the unit. However, this solution introduces severe problems in synchronization of switching in the various resistors. Moreover, extremely rapid switching of the order of the speed of response of the magnetic circuit which is in the order of a few cycles is necessary. However, switching is generally accomplished merely by relays or contactors so that it is possible to have a severe overload applied to the base load switching circuit when regulating from a low to a high voltage before the switching can catch up with the change in regulation. Therefore, it is seen that this solution introduces many auxiliary problems.

A further solution which has been attempted has been in the use of a variable base load resistor such as a power rheostat where, for example, the rheostat could be tapered in the usual manner. Here, again, however, speed of response introduces many problems, and the power rheostat becomes very expensive.

The present invention provides a novel static device which operates with minimum power dissipation and with the same speed as the main regulating reactors. More specifically, the invention provides a non-linear magnetic circuit connected between the main rectifier system and the base load which is statically controlled and has similar operating characteristics to the main amplifier control system. By way of example, the base load circuit is connected in series with the main control reactors and in parallel with the main load circuit, and includes a second set of auxiliary control reactors which control the voltage applied to the base load resistor.

In operation, and with a predetermined regulation condition in the main amplifier circuit, a corresponding condition will occur in the auxiliary amplifying circuit. Thus, where the main circuit is at a high output voltage condition, the control circuit will be at a low output voltage condition whereby current into the base load resistor is considerably restricted.

The control characteristics of the two systems are then so arranged that the output voltage of the auxiliary amplifying structure is so controlled that a relatively constant current will flow through the base load resistor regardless of the operating condition of the main amplifier circuit.

Accordingly, a primary object of this invention is to provide a novel constant current bypass for the rectifier elements of a rectifier system having magnetic control reactors.

Another object of this invention is to provide a novel base load system for magnetically controlled rectifier systems which draws relatively little power regardless of the regulation of the main system.

A further object of this invention is to provide a novel base load power control circuit for magnetically controlled rectifier systems which permits the use of a small, low power base load impedance.

Yet another object of this invention is to provide a novel base load circuit for rectifiers which operates with minimum power loss.

A still further object of this invention is to render the power loss of a base load circuit independent of the range of voltage control of the rectifier circuit associated therewith.

A still further object of this invention is to provide a novel base load circuit for magnetically controlled rectifiers which may be permanently connected in the circuit.

Still another object of this invention is to provide a novel static base load circuit for rectifiers which is unaffected by the speed of the main reactors and operates with a minimum power loss.

These and other objects of this invention will become apparent from the following description when taken in connection with the drawings, in which:

FIGURE 1 schematically illustrates a single phase, full wave rectifier system having a magnetic control circuit utilizing self-saturating reactors along with a base load power control circuit.

FIGURE 2 is similar to FIGURE 1 but is slightly redrawn for simpler understanding with the main power load circuit eliminated.

FIGURE 3 schematically illustrates a family of characteristic curves illustrating the operation of the circuit of FIGURE 2 under a first set of bias conditions.

Figures 6, 7A:
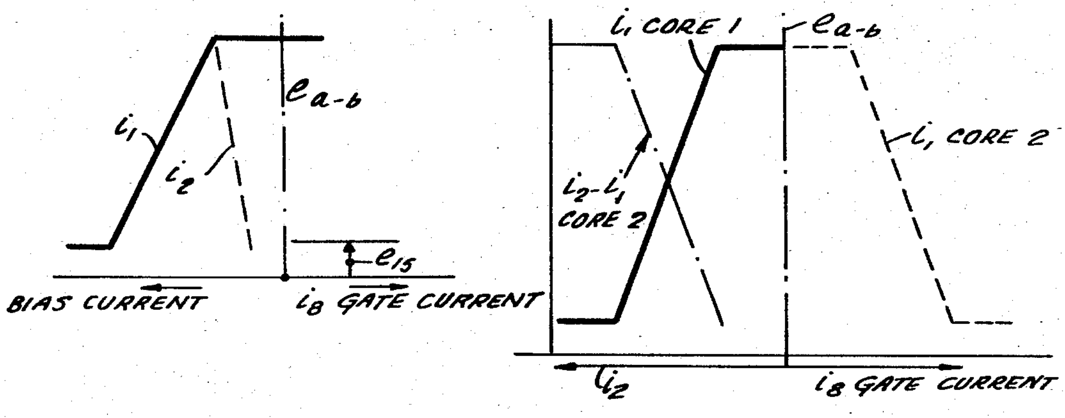
FIGURE 6 shows the required control characteristics for the main amplifier bias as compared to the base load current amplifier bias as derived from FIGURES 3, 4 and 5.
Figure 7:
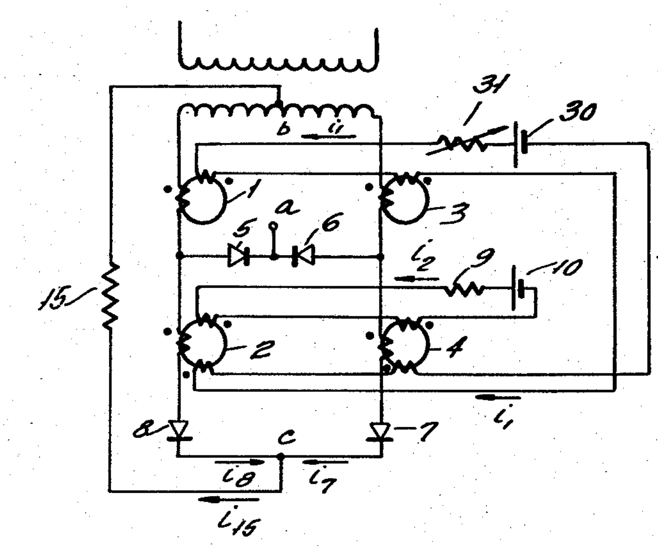
FIGURE 7 is a circuit diagram similar to FIGURE 2 wherein the characteristics of FIGURE 6 are automatically achieved.

FIGURE 7*a* shows the control current characteristics for the circuit of FIGURE 7.

Figure 8:
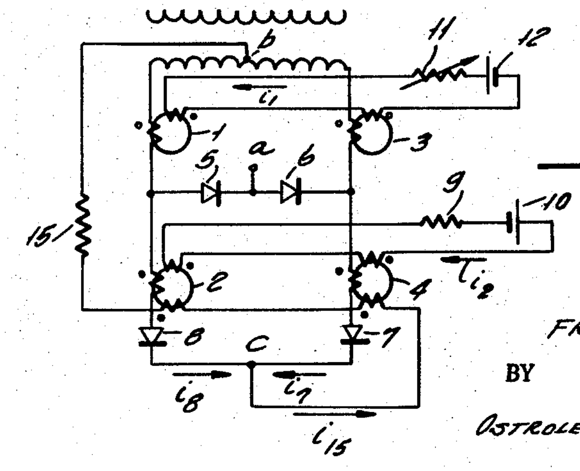

FIGURE 8 illustrates a circuit arrangement in accordance with the invention wherein the effect of the nonlinear characteristic of the cores of the magnetic amplifiers is compensated.

Figure 9:
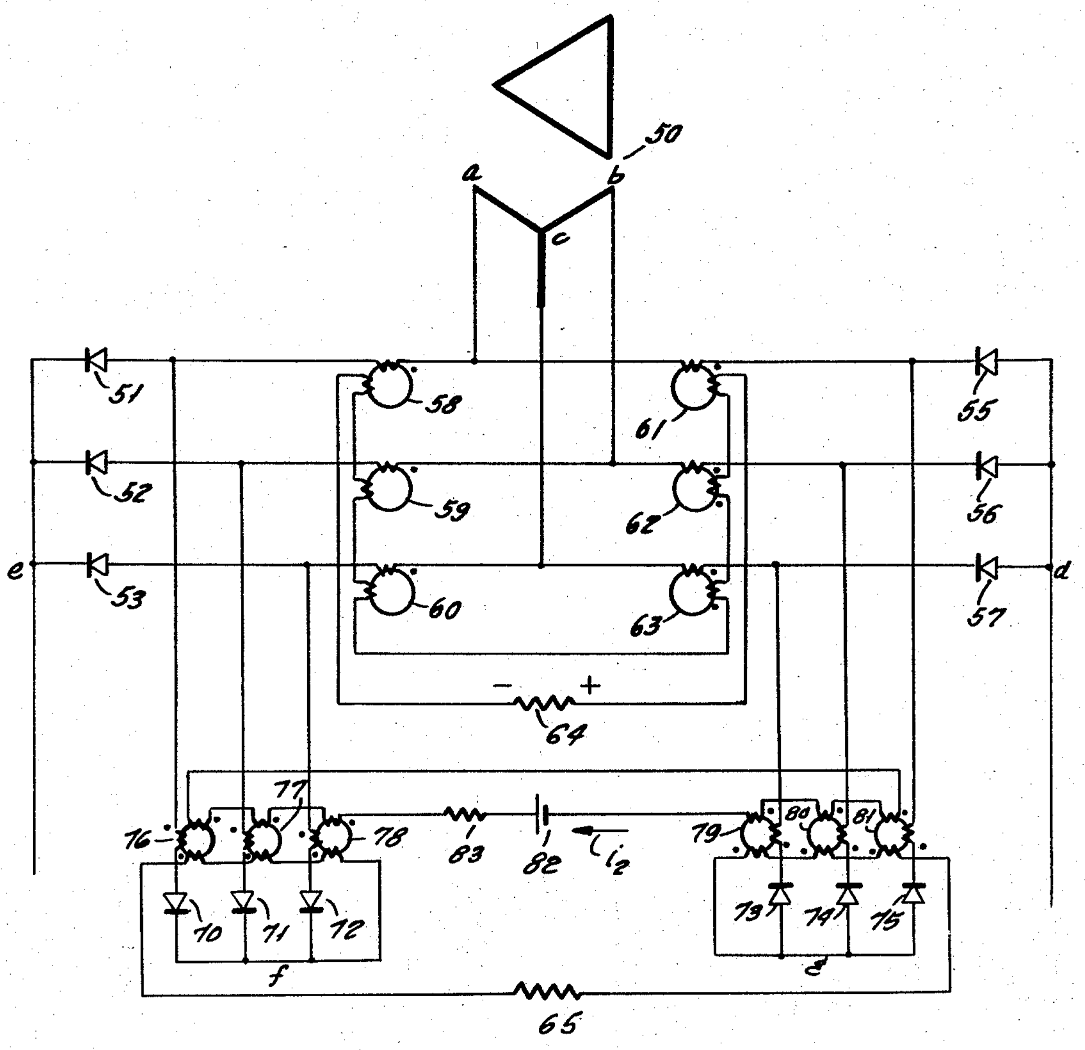

FIGURE 9 illustrates the manner in which the novel base load circuit of the invention may be applied to a three-phase bridge connected rectifier circuit.

Figure 10:
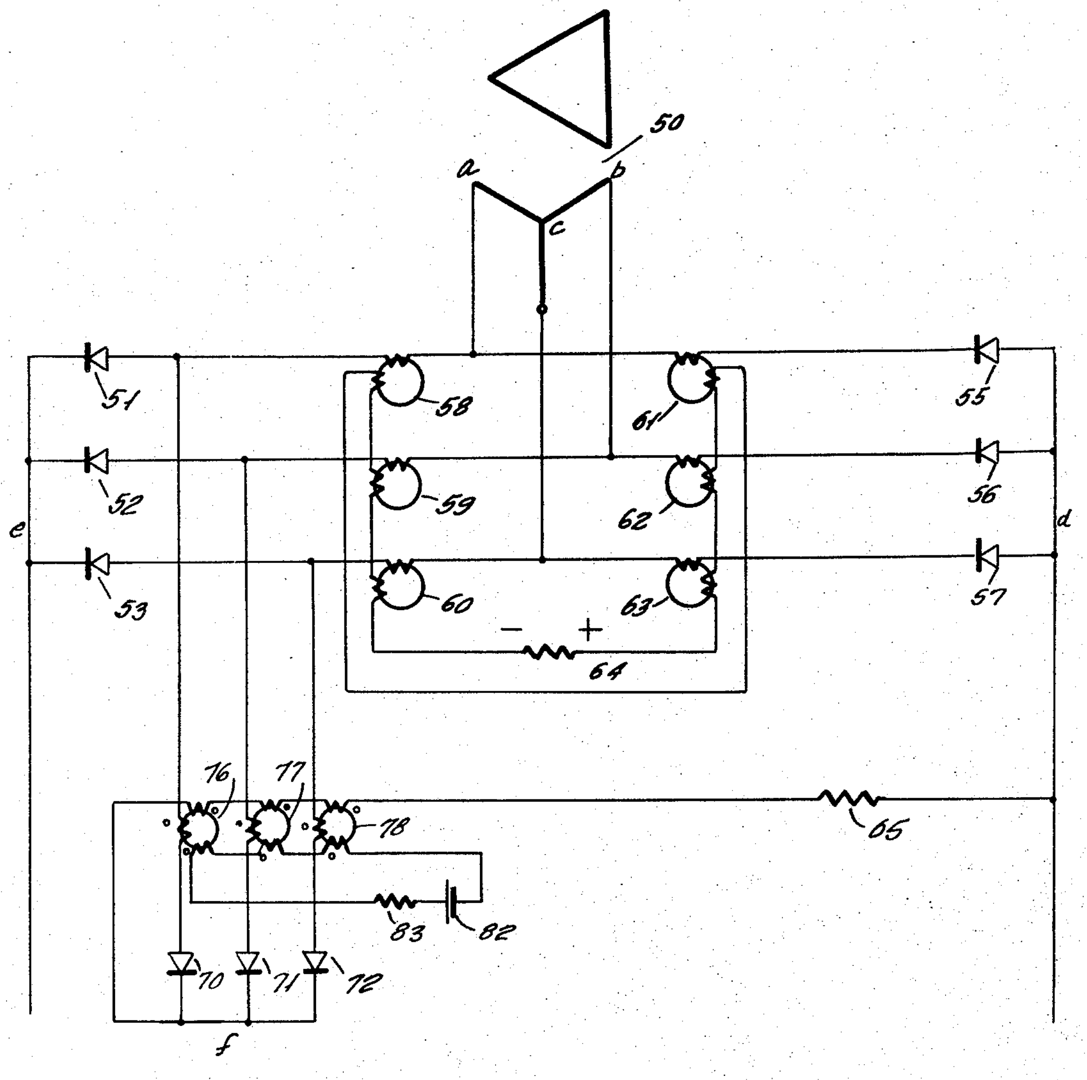

FIGURE 10 illustrates the application of the novel circuit of the invention to a three-phase, double-Y interphase rectifier circuit.

Figure 1:
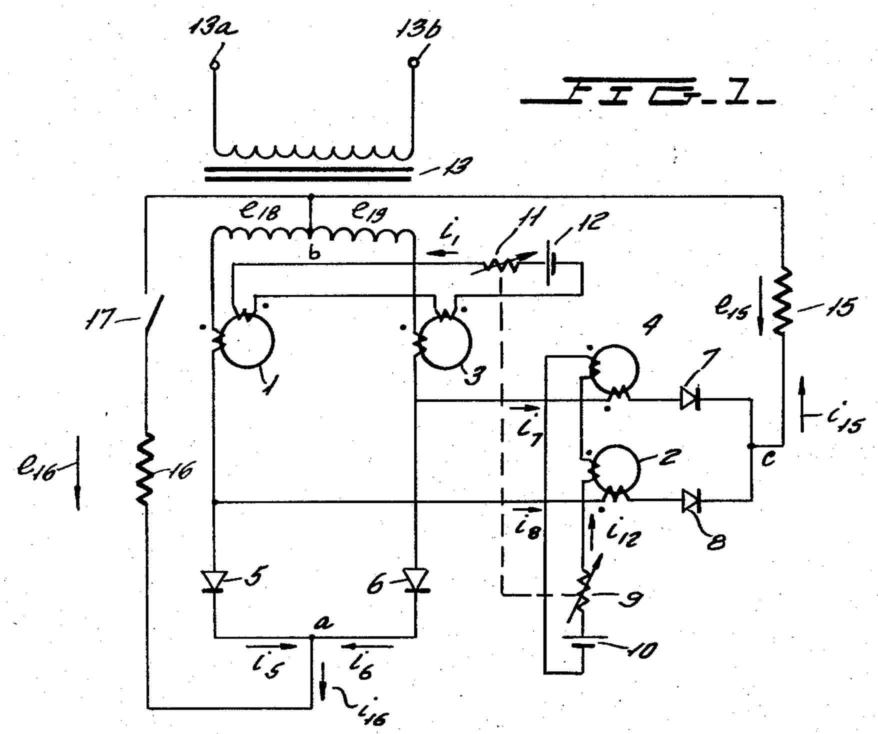

Referring first to FIGURE 1, I have schematically illustrated therein a single phase, full wave rectifier system which includes a power transformer 13 which has a pair of terminals 13*a* and 13*b* connectable to a suitable input A-C source. A pair of control reactors 1 and 3 are then connected in series with rectifier elements 5 and 6 respectively. A point *b* of the secondary winding of transformer 13 and common point *a* of rectifier elements 5 and 6 are then connected in series with a suitable load 16 through a disconnect switch 17.

It will be noted that rectifier elements 5 and 6 may be of any desired type and could, for example, be formed by suitable parallel and/or series connected banks of elements to meet the particular requirements of load 16.

In accordance with the invention, an auxiliary control or amplifier circuit is then provided which includes control reactors 2 and 4 which are connected in series with reactors 1 and 3 resectively. Each of control reactors 2 and 4 are then connected in series with rectifier elements 8 and 7 respectively where the rectifier elements 8 and 7 are connected to a common point and to a base load 15 which is, in turn, connected to point *b* on power transformer 13.

As will be described more fully hereinafter, the control reactors 2 and 4 have the same voltsecond rating as reactors 2 and 4. However, reactors 1 and 3 carry a much smaller maximum current than reactors 1 and 3, and, therefore, are relatively small devices. In a similar manner, rectifier elements 7 and 8 have very small current capacities compared to the main rectifier elements 5 and 6.

A control circuit is then provided for reactors 1 and 3 which includes a suitable D-C source such as battery 12 which is connected in series with adjustable resistor 11. A similar control circuit is provided for reactors 2 and 4, and includes the D-C source 10 connected in series with adjustable resistor 9.

As previously indicated, it is often desirable to operate the main rectifier system of FIGURE 1 under no-load conditions, or a condition where switch 17 is open. To this end, the base load resistor 15 provides a current path over which current can be drawn through control reactors 1 and 3 which is sufficiently high to satisfy the magnetizing current requirements of these reactors.

Thus, with the base load circuit 15 connected in position, a variable D-C voltage may be obtained between points *a* and *b* in FIGURE 1. That is, the voltage between points *a* and *b* is the instantaneous voltage difference between the secondary voltage of transformer 13 and the voltage across reactors 1 and 3. Therefore, by changing the voltage across reactors 1 and 3 by adjustment of the bias current $i_1$, the potential difference between points *a* and *b* can be adjusted. At the same time and in accordance with the invention, it is desirable to hold the voltage between points *b* and *c* at a constant value so that a small constant current will flow through base load resistor 15 under any output voltage appearing between points *a* and *b*. Thus, the resistor 15 will have some relatively small power rating.

In general, the circuit of FIGURE 1 operates in the following manner:

So long as the bias current drawn from source 12 is of a value to require a great deal of flux reversal of reactors 1 and 3 before rectifiers 5 and 6 conduct current as in low output voltage conditions, between terminals *a* and *b* the reactors 2 and 4 can directly connect this low output voltage to base load resistor 15 without regulating down the voltage between terminals *b* and *c*. Thus, a given current level is set.

If now the value of resistor 11 is changed so that the output voltage at points *a* and *b* increases, the circuit so operates that reactors 2 and 4 begin to regulate the output voltage appearing at points *b* and *c* to maintain the relatively constant low output voltage across resistor 15. To this end, resistor 11 can be "ganged" to resistor 9 so that the control characteristics of the main amplifier circuit and auxiliary amplifier circuit are suitably modified.

Figure 2:
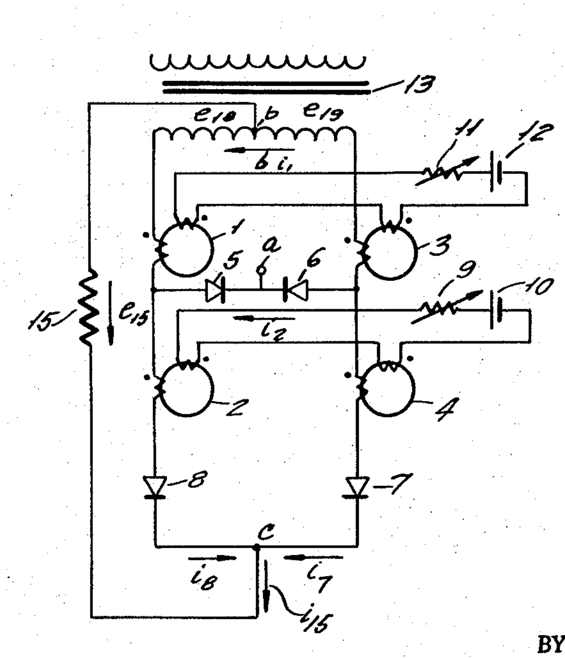

In order to understand the specific manner in which this result is achieved, the circuit of FIGURE 1 is redrawn in a simplified manner in FIGURE 2 with the main load circuit including switch 17 and main load 16 eliminated.

Figure 3:
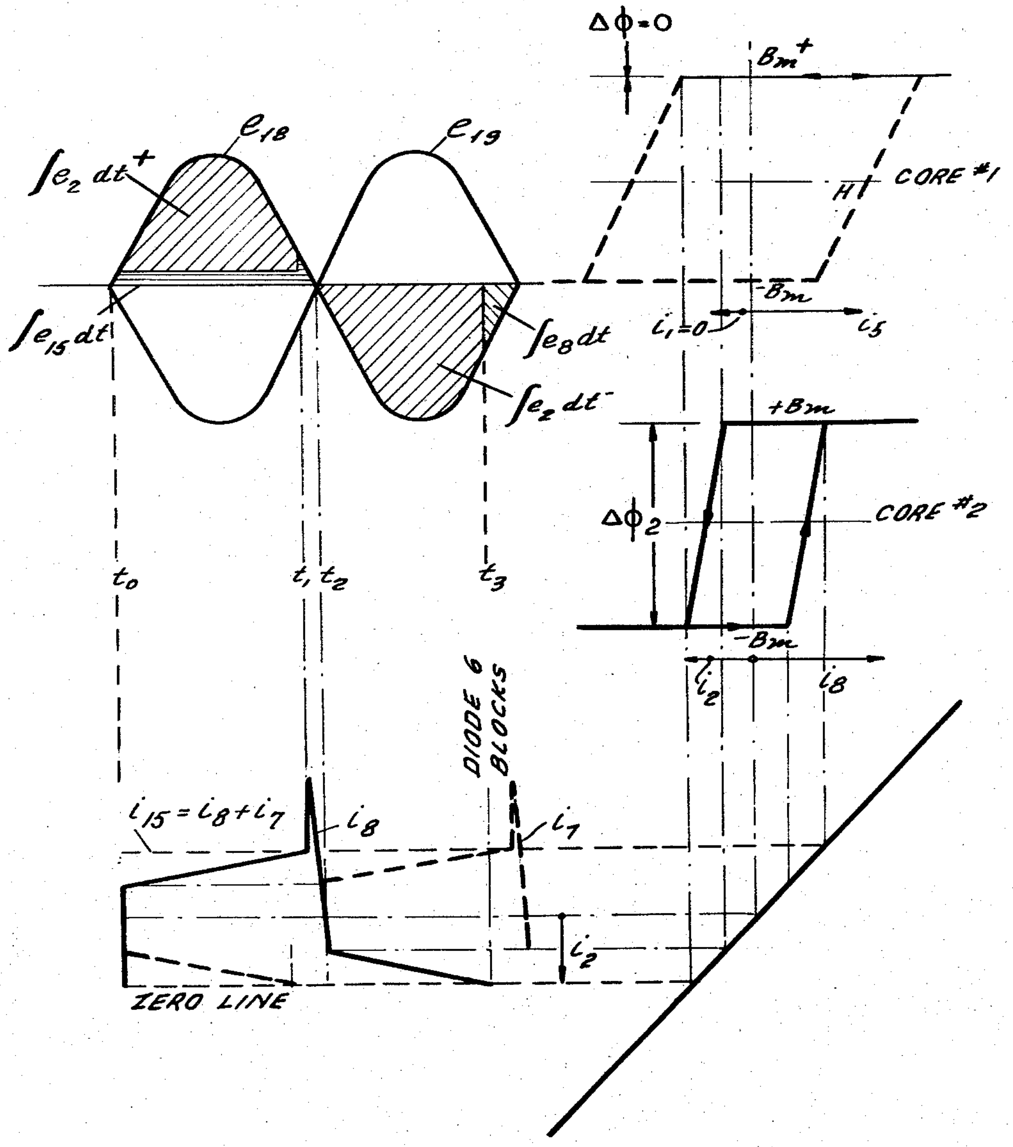
Figure 4:
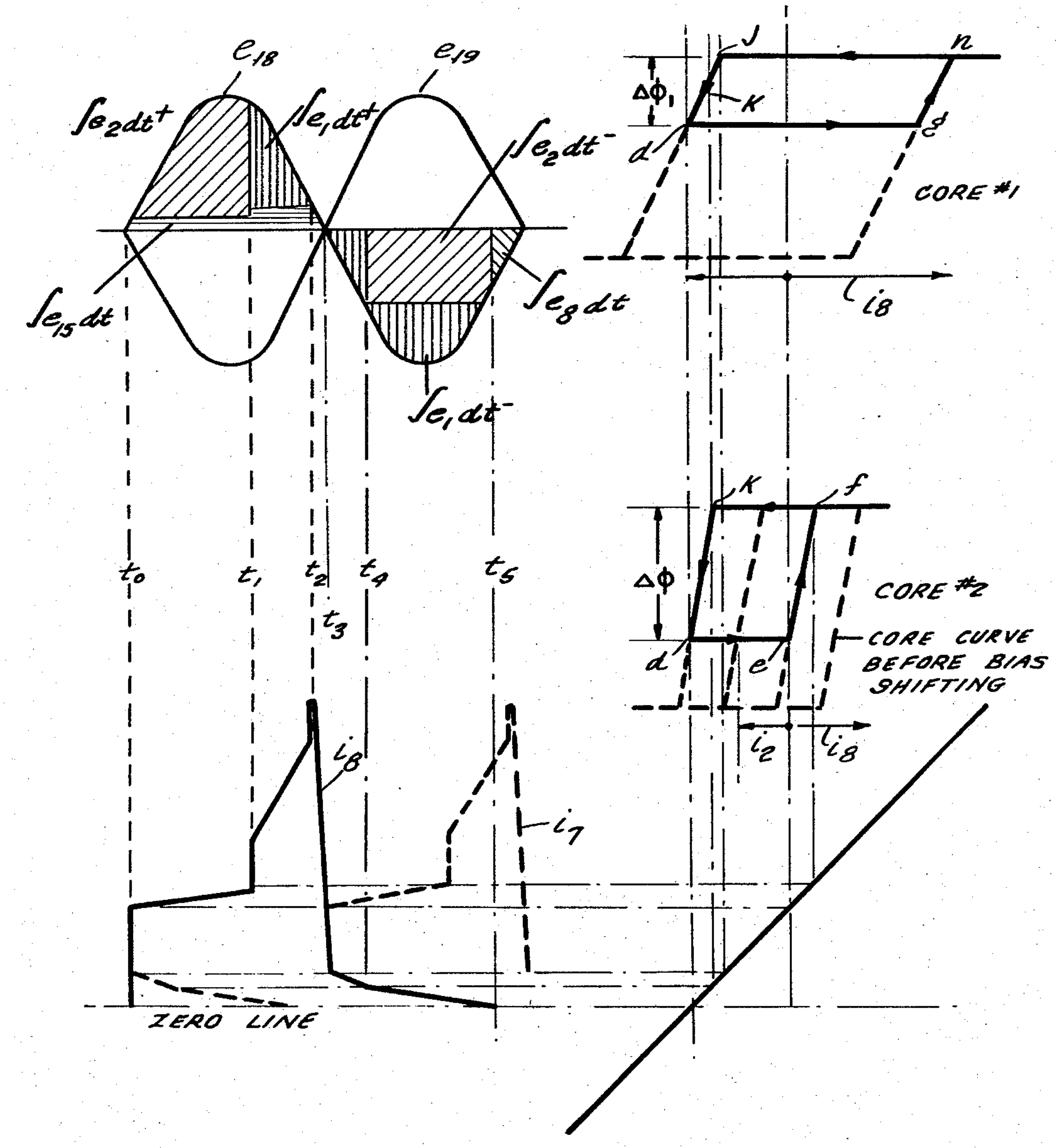
FIGURE 4 is similar to FIGURE 3 and illustrates the characteristic curves for a second bias condition.
Figure 5:
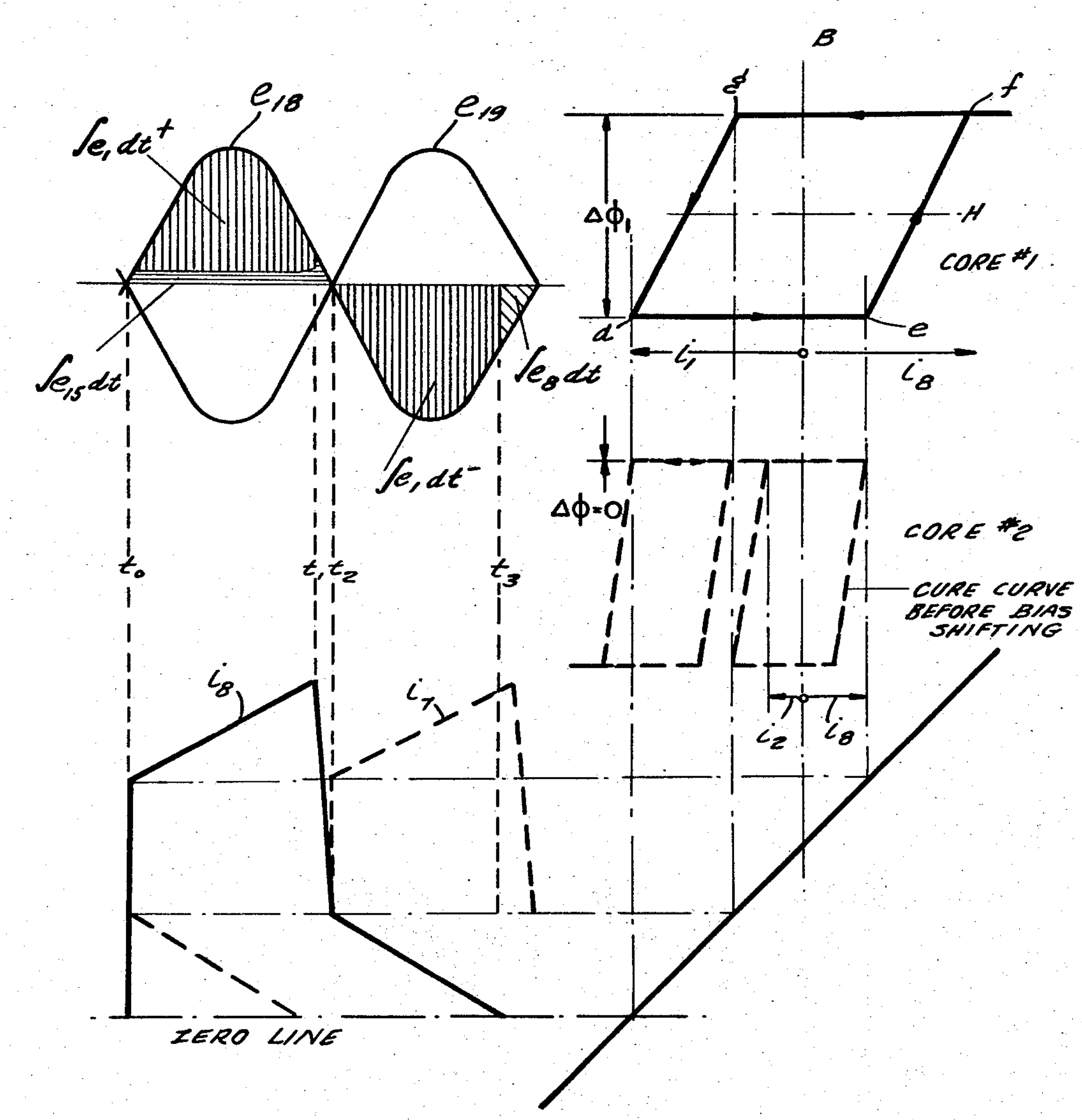
FIGURE 5 is similar to FIGURES 3 and 4 and illustrates a still further operational condition.

The condition of the various components for three different control levels—maximum output voltage, medium output voltage, and minimum output voltage, in reference to potential *a–b*—are then reproduced in FIGURES 3, 4 and 5 respectively in a manner deemed best adapted for an understanding of the operation of the circuit. Thus, each of FIGURES 3, 4 and 5, in their upper left-hand portion show voltage as a function of time for the secondary winding voltage of transformer 13. The right-hand upper portion of the figures then illustrates the B-H curve of the main core 1 (upper portion) and auxiliary core 2 beneath the characteristic for core 1. The operation on the B-H curves in the upper right-hand portion of the figures is then reflected into current-time diagrams appearing in the lower left-hand portion of the figure where time is compared to the time used in the voltage diagram, while current is compared to the currents from the B-H diagrams.

Referring first to FIGURE 3 and the maximum output voltage condition, it is seen that the B-H curve for core 1 has a higher excitation current than the B-H curve for core 2. This is normally the case, since the full load gate current for core 1 will be many times larger than that of core 2 and is in the ratio of $i_{16}$ to $i_{15}$ of FIGURE 1. This requirement causes the mean length per turn of core 1 to be greater than that of core 2 which, in turn, requires the higher excitation current.

In FIGURE 3, core 1 has a zero bias current $i_1$, while core 2 is biased by a positive current $i_2$. These biases will cause a maximum flux change on core 2 and a minimum flux change on core 1. Thus, the output voltage appearing at points *a* and *b* will be at its maximum value, while the output voltage appearing between points *b* and *c* will be at their minimum value.

Beginning at time $t_0$, the gate current $i_8$ of core 2 will increase almost instantaneously, since no flux change is experienced by either core 1 or core 2. From time $t_0$ to time $t_1$, the flux of core 2 changes from $-B_M$ to $+B_M$. During this period of time, the voltage time integral of voltage $e_{18}$, as shown by the cross-hatched area $\int e_2 dt^+$, is completely absorbed by core 2 except for $\int e_{15} dt$ which is dissipated in resistor 15. The gate current $i_8$ then increases as determined by the slope of the B-H curve of core 2. At time $t_1$, core 2 is saturated and, since core 1 has remained saturated, both cores are saturated in the direction of gate current so that all the remaining voltage $e_{18}$ is impressed across the base load resistor 15.

At time $t_2$, the voltage $e_{18}$ reverses polarity. Since core 1 has no bias, its flux cannot be reversed and thus remains at $+B_M$. This voltage is shown as $\int e_2 dt^-$ between times $t_2$ and $t_3$, and is absorbed by core 2 to reverse the flux of core 2 from $+B_M$ to $-B_M$, as shown by $\Delta\phi_2$. The gate current $i_8$ then drops to zero at $t_3$ and the remaining voltage $\int e_8 dt$ is withheld by diode 8.

To summarize the operation of FIGURE 3, when the bias current $i_1$ of core 1 is zero and the bias current of $i_2$ of core 2 is adjusted for minimum output voltage, then a maximum output voltage will be seen at terminals *a–b* of FIGURE 2, while a minimum output voltage appears at terminals *b–c* of FIGURE 2, since most of the voltage falls across reactor 2.

It will be clearly understood that the same phenomena described above applies equally to cross 2 and 3 with regard to the voltage $e_{19}$, except that this will operate 180° out of phase with the operation described herein.

Assuming next that the output voltage at points *a* and *b* is to be regulated down, then some positive bias current $i_1$ will be caused to flow in core 1 by a suitable adjustment of impedance 11. At the same time, adjustment will be made of the bias current flowing in core 2 by adjustment of impedance 9. Thus, in FIGURE 4, the current $i_1$ is increased, while the current $i_2$ has been decreased.

Starting at point *d* on the B-H curve of core 2 of FIGURE 4, it will be seen that the gate current $i_8$ rises almost instantaneously, since it encounters no flux change until it reaches point *e* on the B-H curve. From point *e* to point *f*, core 2 changes its flux by an amount $\Delta\phi_2$ while absorbing $\int e_2 dt^+$ from time $t_0$ to time $t_1$. At time $t_1$, the gate current $i_8$ increases to point *g* on core 1 and then encounters the flux change of core 1 of $\Delta\phi_1$ from point *h* while absorbing $\int e_1 dt^+$ of the gate voltage. At time $t_2$, both of cores 1 and 2 are saturated in the direction of gate current $i_8$, and the remaining voltage will appear across resistor 15.

At time $t_3$, the voltage $e_{18}$ reverses, and the first flux change begins in core 1 at point *j*. The flux of core 1 is reversed from point *j* to point *k* between times $t_3$ and $t_4$. From time $t_4$ to time $t_5$, both of cores 1 and 2 reverse their flux from points *k* to *d*. The total reversal of flux in core 1 is from point *j* to point *d* with a magnitude of $\Delta\phi_1$ while absorbing $\int e_1 dt^-$. The total flux reversal of core 2 from *k* to *d* is $\Delta\phi_2$ whole absorbing the voltage $\int e_2 dt^-$. At point *d* on the two B-H curves of FIGURE 4, and at time $t_5$, both cores 1 and 2 are prevented from further flux reversal by their respective bias currents and by the diode 8. The remaining voltage is then withheld by the diode 8, as shown by $\int e_8 dt$ in FIGURE 4.

As shown in FIGURE 4, approximately ⅓ of the total gate voltage time integral is absorbed on core 1, while ⅔ of this voltage time integral is absorbed on core 2. This indicates that the voltage at points *a* and *b* of FIGURE 2 has decreased by approximately 33⅓ percent of that shown in FIGURE 3. The voltage at terminal points *b* and *c*, however, in FIGURE 2 has remained unchanged when compared to that of FIGURE 3, since the sum of the voltage time integral of cores 1 and 2 remains constant.

A last operating condition is shown in FIGURE 5 where the core 1 has a maximum bias current $i_1$ applied thereto, while the core 2 has a minimum or zero bias $i_2$ applied thereto.

Referring to FIGURE 5 and beginning at time $t_0$, it is seen that current increases to point *e* on the B-H curve of core 1. During this period of time, core 2 is saturated and cannot absorb any of the gate circuit voltage $e_{18}$. At point *e* the current cannot further increase without a flux change in core 1. During the period of time from $t_0$ to $t_1$, the flux on core 2 changes from point *e* to point *f* for a total flux change $\Delta\phi_1$ while absorbing the voltage $\int e_1 dt^+$.

During this period, the gate current $i_8$ increases as required by the slope of the B-H curve of core 1. This current causes a voltage drop $\int e_{15} dt$ on resistor 15 over the ½ cycle gate voltage $e_{18}$. At point *f* and time $t_1$, both cores 1 and 2 are saturated, and the remaining voltage appears across resistor 15 until time $t_2$.

During the negative half cycle of gate voltage $e_{18}$, the $\int e_1 dt^-$ from time $t_2$ to time $t_3$ is absorbed by core 1 while changing its flux from point *g* to point *d* by an amount $\Delta\phi_1$. At time $t_3$, and at point *d* on the B-H curve of core 1, the current becomes zero as determined by the bias current $i_1$. The remaining gate voltage $\int e_8 dt$ is withheld by diode 8.

During the full cycle of gate voltage $e_{18}$, core 2 is prevented from any flux change since it is clamped at positive saturation when no bias is applied to this core. Clearly, the operating conditions shown in FIGURE 5 will cause the voltage at load terminal points *a* and *b* in FIGURE 2 to be at a minimum, since almost the entire gate voltage is absorbed by reactor 1. Again, the auxiliary circuit voltage at points *d* and *c* is held constant, and is at its minimum regulated value.

The control requirements for the main core 1 and auxiliary core 2 of FIGURES 1 and 2 are particularly shown in FIGURE 6 to achieve the type operation shown in FIGURES 3, 4 and 5.

Thus, FIGURE 6 shows bias currents $i_1$ and $i_2$ as a function of the output voltage $e_{a-b}$, which is the output voltage at points *a* and *b* in FIGURES 1 and 2. It is seen, therefore, that the control current $i_1$ varies inversely with control current $i_2$. This could, of course, be easily obtained in FIGURES 1 and 2 by suitably arranging impedances 9 and 11 in tandem with one another so that as the impedance of one increases, the impedance of the other decreases in magnitude. Clearly, these adjustable resistors could be either manually or automatically driven.

Another manner in which the control characteristic of FIGURE 6 could be achieved is illustrated in the circuit diagram of FIGURE 7 which is similar to FIGURE 2, but connects the bias circuit of core 1 to the bias circuits of cores 2 and 4 in opposition to the bias circuit including source 10. More specifically, FIGURE 7 shows a common source of D-C voltage 30 in series with a common adjustable resistor 31 which is connected in series with control windings of each of reactors 1, 2, 3 and 4. The polarities of the control windings on cores 2 and 4, however, are so arranged with respect to the control winding connected to source 10 that an increasing control current for reactors 1 and 3 corresponds to a decreasing control current for reactors 2 and 4.

A characteristic control curve of the type shown in FIGURE 7*b* is obtained where the control current applied to core 2 is the equivalent of the current $i_2$ minus $i_1$ in FIGURE 6.

The circuit arrangements shown in FIGURES 2 and 7 presume that the B-H curves of the cores are completely linear. Since this is not the actual condition, the voltage applied to the load resistor 15 in FIGURES 2 and 7 will vary in accordance with the non-linearity of the B-H curves of the cores.

FIGURE 8 illustrates a further modification of the circuit of the invention which provides a more constant output voltage from the auxiliary amplifier, notwithstanding the non-linearities of the B-H curves. More specifically, in FIGURE 8 the base load current in resistor 15 is connected to auxiliary control windings on each of cores 2 and 4. This serves as a feed-back circuit for cores 2 and 4 which tends to maintain a constant current through resistor 15.

Thus, if the load current in resistor 15 tends to vary from some preselected value, the feed-back action of reactors 2 and 4 will cause an increase or decrease in voltage regulation to prevent the measured change in current through resistor 15.

Where the arrangement of FIGURE 8 is used, it will be noted that only a single control need be provided such as the adjustable resistor 11, while resistor 9 could, for example, be a fixed resistance.

While the novel circuit of the invention has been shown in FIGURES 2, 7 and 8 for the case of a single phase system, it will be apparent that the circuit is applicable to any type connection, and is particularly applicable to the usual form of three-phase rectifier systems in common commercial use.

FIGURE 9 illustrates the manner in which the novel circuit of the invention may be applied to a three-phase, full wave bridge connected rectifier system. More specifically, the rectifier system of FIGURE 9 utilizes the feedback concepts of FIGURE 8, and is comprised of a main power transformer 50 which is connected to bridge connected rectifier elements 51 through 57. Each of rectifier elements 51 through 57 have respective main control reactors 58 through 63 respectively associated therewith which have control windings connected to a suitable source of bias current 64. A base load impedance 65 is then connected to the auxiliary three-phase bridge connected magnetic amplifier system which includes rectifiers 70 through 75 and control reactors 76 through 81 respectively.

A source of bias current is then provided for the auxiliary reactors and includes a suitable D-C source 82 and resistor 83.

The cores 76 through 81 are further provided with suitable feed-back windings for connection to base load resistor 65 in the manner described in FIGURE 8. Clearly, the operation of each phase of the multiphase unit of FIGURE 9 will operate in the manner identical to that previously described with reference to FIGURE 8 with suitable adjustments being made for operation in the multiphase mode as contrasted to the single phase mode.

The essence of the arrangement of FIGURE 9 is that the output voltage applied to the base load 65 will be a constant D-C voltage regardless of the state of output voltage control of the main rectifier unit. Thus, a small low-power dissipating impedance can be used for the base load 65.

FIGURE 10 is similar to the three-phase connected rectifier system of FIGURE 9 where similar components have been given identical identifying numerals. FIGURE 10, however, provides a simplified arrangement wherein the control structure for base load impedance 65 only includes cores 76 through 78 on one half of the bridge. Under these conditions, the terminal voltage is limited to a 100% to 50% range in order to keep the auxiliary voltage between points *f* and *d* constant. That is to say, the maximum voltage time integral that auxiliary cores 76 through 78 can absorb is 50% of the total maximum available. Therefore, the maximum output at terminals *e* and *d* across the load 65 will be 50% of the maximum value. However, at the other extreme where the voltage between points *e* and *d* is at a minimum, if this is lower than 50% of the maximum voltage, the voltage between points *f* and *d* can vary almost 50%.

Although this invention has been described with respect to its preferred embodiments, it should be understood that many variations and modifications will now be apparent to those skilled in the art, and it is preferred, therefore, that the scope of the invention be limited not by the specific disclosure herein but only by the appended claims.

The embodiments of the invention in which an exclusive privilege or property is claimed are defined as follows:

1. In combination: a rectifier circuit, comprising an A-C transformer, D-C output terminals, rectifier means connected between said A-C transformer and said D-C output terminals, and output voltage control circuit means connected in series with said rectifier means and between said A-C transformer and said D-C output terminals; a base load circuit connected in series with said A-C transformer and said output voltage control circuit means and including a base load impedance and an auxiliary voltage control circuit for controlling the voltage applied from said transformer means to said base load impedance; said output voltage control circuit and said auxiliary voltage control circuit having respective operating control means; said operating control means of said output voltage control circuit and said auxiliary voltage control circuit being connected together whereby the output voltage of said auxiliary voltage control circuit is relatively constant when said output voltage control circuit is adjusted through a predetermined range of output voltages of said rectifier circuit.

2. The combination as set forth in claim 1 wherein said output voltage control circuit includes a saturable reactor and a flux control circuit connected thereto.

3. The combination as set forth in claim 2 wherein said auxiliary voltage control circuit includes an auxiliary saturable reactor having an auxiliary flux control circuit connected thereto.

4. The combination as set forth in claim 3 wherein said saturable reactor is connected in series with said auxiliary saturable reactor; each of said reactors having substantially the same voltsecond rating.

5. The combination as set forth in claim 4 wherein each of said flux control circuits include an adjustable impedance means; said adjustable impedance means being mechanically ganged together for coordinated control operation.

6. A base load circuit for a rectifier system; said rectifier system including the series connection of an A-C source, a D-C load, a rectifier element and a first control reactor; a first flux control circuit connected to said first control reactor; said base load circuit including a second control reactor, a second rectifier element and an impedance connected in series with said first control reactor and said A-C source; a second flux control circuit for said second control reactor; said second control reactor controlling the voltage applied to said base load impedance from said A-C source; said second flux control circuit varying the flux condition of said second control reactor to maintain said voltage applied to said base load impedance relatively constant regardless of control of said first control reactor by said first flux control circuit and wherein said first and second flux control circuits are connected together whereby an increased control current in one corresponds to a decreased control current in the other.

References Cited

UNITED STATES PATENTS

| | | | |
|---|---|---|---|
| 2,878,437 | 3/1959 | Christie et al. | 321—25 X |
| 2,946,000 | 7/1960 | Malick | 330—8 X |
| 3,139,576 | 6/1964 | La Fuze | 330—8 X |
| 3,271,690 | 9/1966 | Cockrell | 330—8 |

ROY LAKE, *Primary Examiner.*

NATHAN KAUFMAN, *Examiner.*